(12) United States Patent
Chen et al.

(10) Patent No.: US 7,659,767 B2
(45) Date of Patent: Feb. 9, 2010

(54) BOOST CIRCUIT AND LEVEL SHIFTER

(75) Inventors: Yen-Wen Chen, Taipei County (TW); Yen-Ynn Chou, Taipei County (TW)

(73) Assignee: Princeton Technology Corporation, Taipei County (TW)

( * ) Notice: Subject to any disclaimer, the term of this patent is extended or adjusted under 35 U.S.C. 154(b) by 0 days.

(21) Appl. No.: 12/194,348

(22) Filed: Aug. 19, 2008

(65) Prior Publication Data
US 2008/0303578 A1   Dec. 11, 2008

Related U.S. Application Data

(62) Division of application No. 11/727,556, filed on Mar. 27, 2007.

(30) Foreign Application Priority Data
Dec. 6, 2006  (TW) .............................. 95145330 A

(51) Int. Cl.
*H03L 5/00* (2006.01)
(52) U.S. Cl. .................. 327/333; 365/189.11
(58) Field of Classification Search ............ 365/189.11; 327/333
See application file for complete search history.

(56) References Cited

U.S. PATENT DOCUMENTS

| 7,180,355 | B2 * | 2/2007 | Teraishi | 327/333 |
| 7,368,970 | B2 * | 5/2008 | Lin et al. | 327/333 |
| 7,511,709 | B2 * | 3/2009 | Koyama et al. | 345/206 |
| 7,514,960 | B2 * | 4/2009 | Shimaya | 326/68 |
| 2002/0153934 | A1 * | 10/2002 | Yoon | 327/333 |
| 2008/0265972 | A1 * | 10/2008 | Nakamura et al. | 327/333 |

\* cited by examiner

*Primary Examiner*—Lincoln Donovan
*Assistant Examiner*—Adam D Houston
(74) *Attorney, Agent, or Firm*—Muncy, Geissler, Olds & Lowe, PLLC

(57) ABSTRACT

A level shifter including a first boost circuit, an inverter, a second boost circuit and a level shift circuit is disclosed. The first boost circuit receives an input signal, and a first amplification factor for the input signal is determined based on a control signal. The inverter receives the input signal to generate an inverted input signal. The second boost circuit is coupled to an output terminal of the inverter to receive the inverted input signal, and a second amplification factor for the inverted input signal is determined based on the control signal. The level shift circuit has a first input terminal and a second input terminal respectively coupled to output terminals of the first boost circuit and second boost circuit to change the voltage level of output signals from the first boost circuit and second boost circuit to a first voltage level.

6 Claims, 3 Drawing Sheets

BOOST CIRCUIT AND LEVEL SHIFTER

CROSS-REFERENCE TO RELATED APPLICATIONS

This application is a Divisional of co-pending application Ser. No. 11/727,556, filed on Mar. 27, 2007, and for which priority is claimed under 35 U.S.C. §120; and this application claims priority of Application No. 095145330 filed in Taiwan, R.O.C. on Dec. 6, 2006 under 35 U.S.C. §119; the entire contents of all of which are hereby incorporated by reference.

BACKGROUND OF THE INVENTION

1. Field of the Invention

The invention relates to a level shifter, and more particularly to a two-stage level shifter with a boost circuit.

2. Brief Description of the Related Art

The conventional voltage pull-up circuit is typically implemented by a level shifter. The level shifter includes two input terminals respectively receiving an input signal and an inverted input signal. In a typical level shifter, the input terminal is electrically connected to the gate of a transistor. If the output current of the level shifter needs to be increased, the W/L ratio of the transistor coupled to the input terminal must be raised firstly, thus, the layout area of the level shifter will be increased. To completely turn on an NMOS transistor, the input positive voltage applied to the gate of the NMOS transistor must exceed a predetermined voltage level. If the input positive voltage applied to the gate of the NMOS transistor does not exceed the predetermined voltage level, the NMOS transistor can not be completely turned on and only outputs small output current. If the voltage level of the input signal applied to the level shift does not exceed a predetermined voltage level, the level shifter may be not properly driven.

BRIEF SUMMARY OF THE INVENTION

In one aspect of the invention, a boost circuit comprising a first transistor, a second transistor, a capacitor module, a third transistor, a fourth transistor and a fifth transistor is provided. The first transistor has a first source, a first gate and a first drain, wherein the first source is coupled to a voltage source. The second transistor has a second source, a second gate and a second drain, wherein the second drain is coupled to the first drain, the second source is grounded, and the second gate is coupled to the first gate to receive an input signal. The capacitor module has a first terminal and a second terminal, and is controlled by a control signal to change a capacitance of the capacitor module for changing the discharge time of the capacitor module, wherein the first terminal is coupled to the first drain and the second drain. The third transistor has a third source, a third gate and a third drain, wherein the third source is coupled to the voltage source, and the third gate is coupled to an output terminal. The fourth transistor has a fourth source, a fourth gate and a fourth drain, wherein the fourth gate receives the input signal, the fourth source and the third drain are coupled to the second terminal of the capacitor module, and the fourth drain is coupled to the output terminal. The fifth transistor has a fifth source, a fifth gate and a fifth drain, wherein the fifth gate receives the input signal, the fifth drain is coupled to the output terminal, and the fifth source is grounded.

In another aspect of the invention, a level shifter comprises a first boost circuit, an inverter, a second boost circuit and a level shift circuit is provided. The first boost circuit receives an input signal, and determines a first amplification factor of the input signal based on a control signal. The inverter receives the input signal to generate an inverted input signal. The second boost circuit is coupled to an output terminal of the inverter to receive the inverted input signal, and to determine a second amplification factor of the inverted input signal based on the control signal. The level shift circuit has a first input terminal and a second input terminal respectively coupled to output terminals of the first boost circuit and second boost circuit to change the voltage level of output signals from the first boost circuit and second boost circuit to a first voltage level.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the subsequent detailed description and the accompanying drawings, which are given by way of illustration only, and thus are not limitative of the present invention, and wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
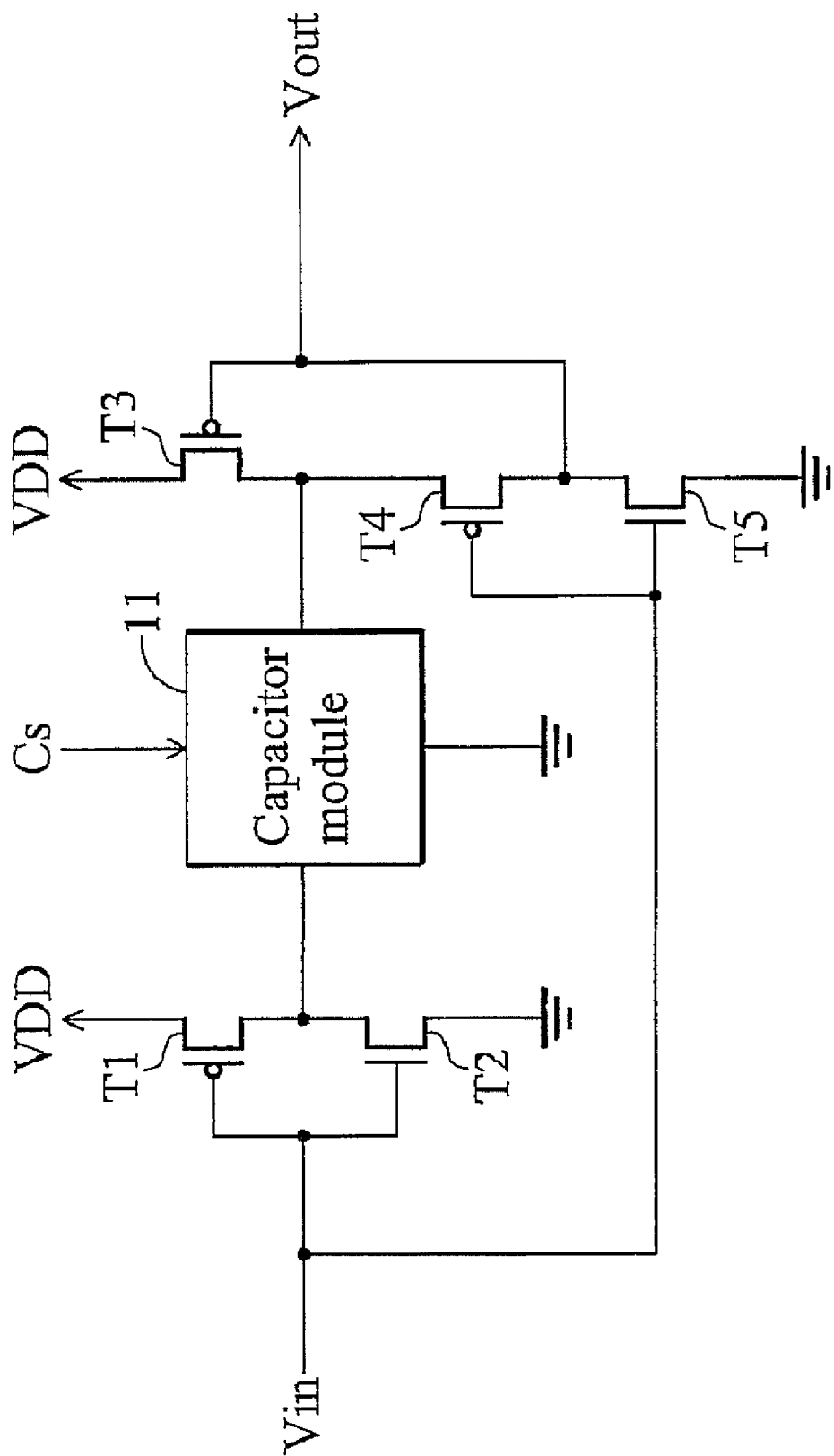
FIG. 1 is a circuit diagram of an embodiment of a boost circuit of the invention.

FIG. 1 is a circuit diagram of an embodiment of a boost circuit of the invention. The transistor T1 has a first source, a first gate and a first drain, wherein the first source is coupled to a voltage source VDD. The second transistor T2 has a second source, a second gate and a second drain, wherein the second drain is coupled to the first drain, the second source is grounded, and the second gate is coupled to the first gate to receive an input signal Vin. The capacitor module 11 has a first terminal and a second terminal, and is controlled by a control signal Cs to change a capacitance of the capacitor module for changing the discharge time of the capacitor module, wherein the first terminal is coupled to the first drain and the second drain. The capacitor module 11 includes a first capacitor and a second capacitor, the first capacitor is further coupled to a switch device, and the first capacitor is connected in parallel to the second capacitor in response to the switch device is turned on based on the control signal. In one embodiment, the first capacitor and the second capacitor can be formed by transistors. The third transistor T3 has a third source, a third gate and a third drain, wherein the third source is coupled to the voltage source VDD, and the third gate is used for outputting an output signal Vout. The fourth transistor T4 has a fourth source a fourth gate and a fourth drain, wherein the fourth gate receives the input signal Vin, the fourth source and the third drain are coupled to the second terminal of the capacitor module 11, and the fourth drain outputs the output signal Vout. The fifth transistor T5 has a fifth source, a fifth gate and a fifth drain, wherein the fifth gate receives the input signal Vin, the fifth drain outputs the output signal Vout, and the fifth source is grounded.

When the input signal Vin is at high voltage level, the transistor T5 is turned on and the voltage level of the output signal is 0. The voltage level of the third drain is at VDD because the capacitor module 11 is charged in a previous cycle. When the input signal Vin is at low voltage level, the capacitor module 11 is charged by the voltage VDD and the voltage level of the third drain is pulled up to 2VDD. Because the input signal Vin is at low voltage level, the transistor T5 and the transistor T4 are turned on, thus, the voltage level of the output signal is 2VDD. In this embodiment, the capacitance and the discharge time of the capacitor module 11 can be changed by the control signal Cs.

Figure 2:
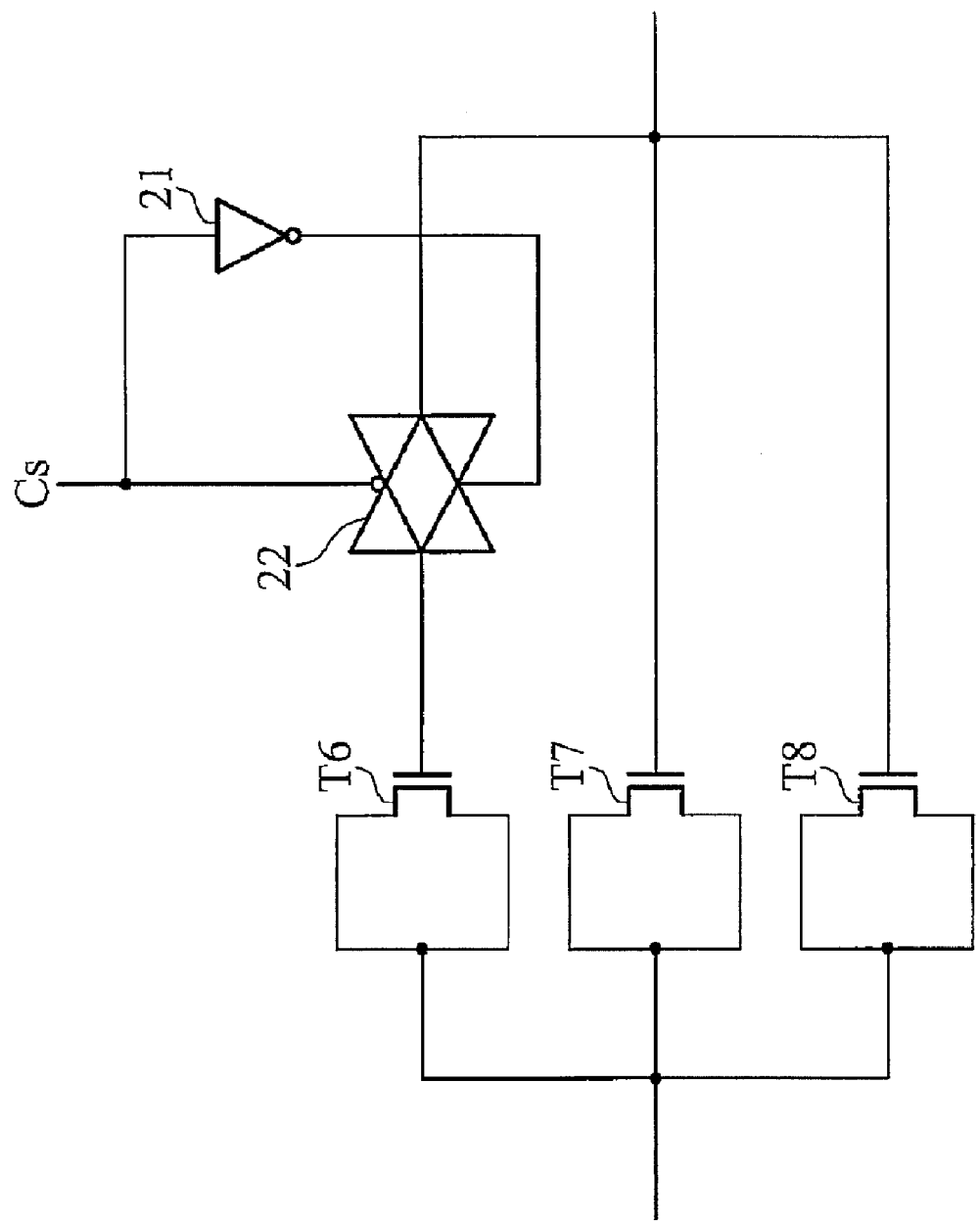
FIG. 2 shows an embodiment of the capacitor module 11 in FIG. 1.

For further illustration, please refer to FIG. 2. FIG. 2 shows an embodiment of the capacitor module 11 in FIG. 1. The sources and drains of transistor T6, T7 and T8 are coupled to the first terminal of the capacitor module 11. The gates of the transistor T7 and transistor T8 are coupled to the second terminal of the capacitor module 11. The gate of transistor T6 is coupled to a transmission gate 22. The transmission gate 22 is controlled by two control signals, control signal Cs and the inverted control signal from inverter 21. When the transmission gate 22 is turned off, the capacitance of the capacitor module 11 is determined by the capacitor formed by the transistors T7 and T8. When the transmission gate 22 is turned on, the capacitance of the capacitor module 11 is determined by the capacitor formed by the transistors T6, T7 and T8. According to the described architecture of capacitor module 11, the capacitance and the discharge time of the capacitor module 11 can be changed by the control signal Cs.

Figure 3:
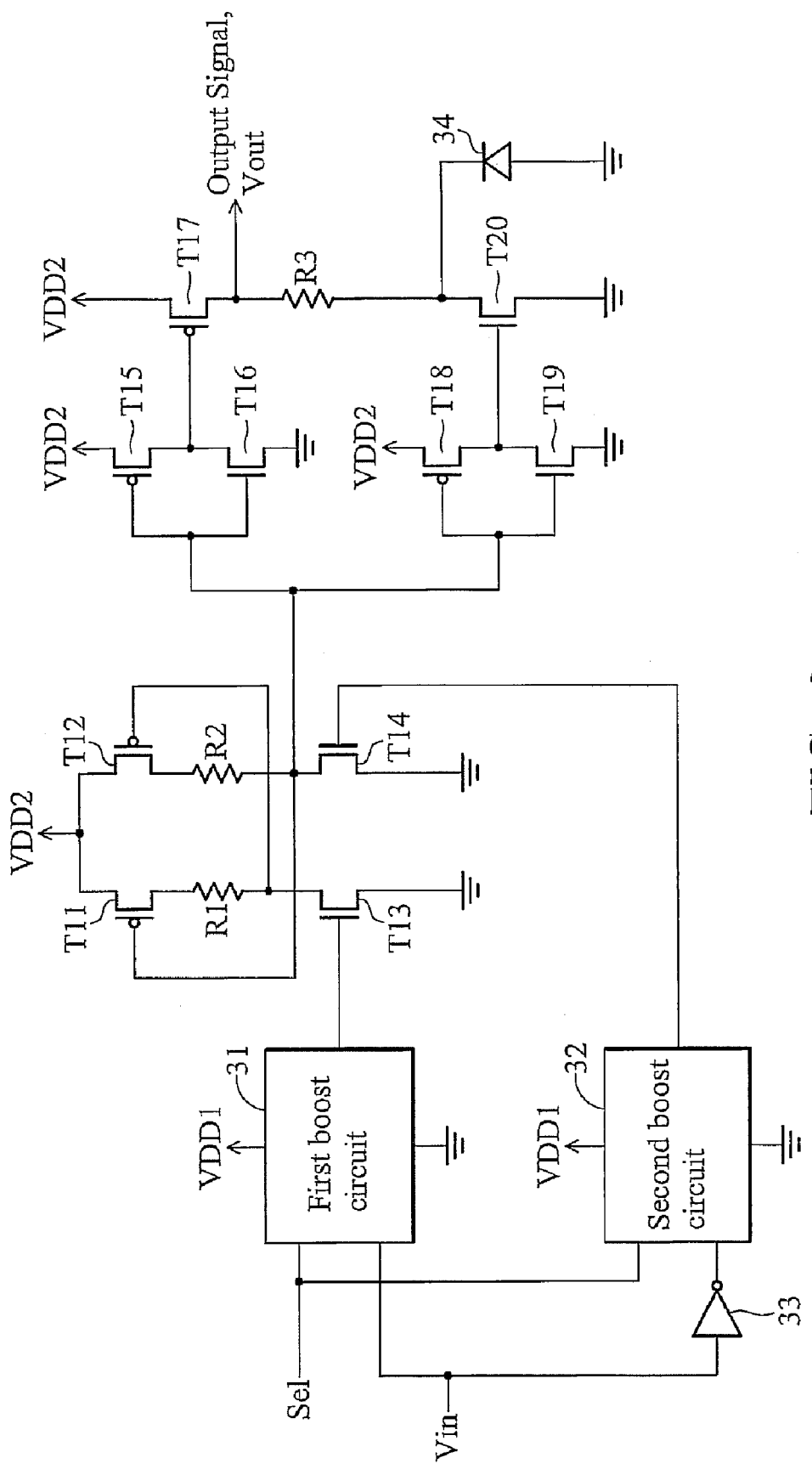
FIG. 3 is a circuit diagram of an embodiment of a level shifter in accordance with the invention.

FIG. 3 is a circuit diagram of an embodiment of a level shifter in accordance with the invention. The first boost circuit 31, coupled to the first voltage source VDD1, receives the input signal Vin and determines the first amplification factor for the input signal Vin based on the control signal Se1. The second boost circuit 32 is coupled to the first voltage source VDD1 and the output terminal of the inverter 33 to receive the inverted input signal Vin and to determine the second amplification factor for the inverted input signal Vin based on the control signal Se1. Embodiments of the first boost circuit 31 and the second boost circuit 32 are illustrated in FIG. 1. The transistor T11 has a source, a gate and a drain, wherein the source of the transistor T11 is coupled to the second voltage source VDD2, the drain of the transistor T11 is coupled to one terminal of the resistor R1. The transistor T12 has a source, a gate and a drain, wherein the source of the transistor T12 is coupled to the second voltage source VDD2, the drain of the transistor T12 is coupled to one terminal of the resistor R2, and the gate of the transistor T12 is coupled to another terminal of the resistor R1. The transistor T13 has a source, a gate and a drain, wherein the drain of the transistor T13 is coupled to the gate of the transistor T12, the gate of the transistor T13 receives the output signal of the first boost circuit 31, and the source of the transistor T13 is grounded. The transistor T14 has a source, a gate and a drain, wherein the drain of the transistor T14 is coupled to the gate of the transistor T11, the gate of the transistor T14 receives the output signal of the second boost circuit 32, and the source of the transistor T14 is grounded. The transistor T15 has a source, a gate and a drain, wherein the source of the transistor T15 is coupled to the second voltage source VDD2, and the gate of the transistor T15 is coupled to the gate of the transistor T11. The transistor T16 has a source, a gate and a drain, wherein the drain of the transistor T16 is coupled to the drain of the transistor T15, the gate of the transistor T16 is coupled to the gate of the transistor T11, and the source of the transistor T16 is grounded. The transistor T17 has a source, a gate and a drain, wherein the source of the transistor T17 is coupled to the second voltage source VDD2, the gate of the transistor T17 is coupled to the drains of the transistors T15 and T16, the drain of the transistor T17 is coupled to one terminal of the resistor R3, and outputs the output signal Vout. The transistor T18 has a source, a gate and a drain, wherein the source of the transistor T18 is coupled to the second voltage source VDD2, and the gate of the transistor T18 is coupled to the gate of the transistor T11. The transistor T19 has a source, a gate and a drain, wherein the drain of the transistor T19 is coupled to the drain of the transistor T18, the gate of the transistor T19 is coupled to the gate of the transistor T11, and the source of the transistor T19 is grounded. The transistor T20 has a source, a gate and a drain, wherein the gate of the transistor T20 is coupled to the drains of the transistors T18 and T19, the drain of the transistor T20 is coupled to another terminal of the resistor R3, and the source of the transistor T20 is grounded. The cathode of the diode 34 is coupled between the drain of the transistor T20 and the resistor R3, and the anode of the diode 34 is grounded.

When the output signal of the second boost circuit 32 is at low voltage level and the transistors T12 and T13 are turned on, the transistors T16 and T17 are turned on, and the voltage level of the output signal Vout is VDD2. In FIG. 3, the voltage level of the input signal Vin is pulled up to 2VDD1 by the first boost circuit 31 or the second boost circuit 32, and a voltage shifting circuit then pulls up the voltage level of the output signal of the first boost circuit 31 or the second boost circuit 32 from 2VDD1 to VDD2. In this embodiment, the voltage shifting circuit comprises diode 34 and transistors T11 to T20, wherein the gates of the transistor T13 and T14 denote the input terminals of the voltage shifting circuit, and the drain of the transistor T17 outputs an output signal. Although the layout area of the level shifter shown in FIG. 3 increases due to the first boost circuit 31 and the second boost circuit 32, the performance of level shifter also significantly increases. Furthermore, the first boost circuit 31 and the second boost circuit 32 are the low operating voltage elements, thus, the total power consumption increases only slightly. Further, the level shifter shown in FIG. 3 avoids DC current generation and breakdown voltage issues.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A level shifter, comprising:
a first boost circuit for receiving an input signal and determining a first amplification factor of the input signal based on a control signal, wherein the first boost circuit is powered by a first voltage source, and the first amplification factor of the input signal is dependent on the voltage level of the first voltage source;
a first inverter for receiving the input signal to generate an inverted input signal;
a second boost circuit coupled to an output terminal of the inverter to receive the inverted input signal and to determine a second amplification factor of the inverted input signal based on the control signal, wherein the second boost circuit is powered by the first voltage source, and the second amplification factor is dependent on the voltage level of the first voltage source; and a level shift circuit powered by a second voltage source with the voltage level higher than that of the first voltage source, wherein the level shift circuit has a first input terminal and a second input terminal respectively coupled to output terminals of the first boost circuit and second boost circuit to generate an output signal according to output signals from the first boost circuit and second boost circuit, wherein a level shift of the output of the level shift circuit is dependent on the first voltage source and the second voltage source.

2. The level shifter as claimed in claim 1, wherein each of the first and second boost circuits comprises:

a first transistor, having a first source, a first gate and a first drain, wherein the first source is coupled to the first voltage source and the first gate receives the input signal;

a second transistor, having a second source, a second gate and a second drain, wherein the second source is coupled to ground, the second gate is coupled to the first gate and the second drain is coupled to the first drain;

a third transistor, having a third source, a third gate and a third drain, wherein the third source is coupled to the first voltage source;

a fourth transistor, having a fourth source, a fourth gate and a fourth drain, wherein the fourth source is coupled to the third drain;

a fifth transistor, having a fifth source, a fifth gate and a fifth drain, wherein the fifth source is coupled to the ground, the fifth gate receives the input signal and is coupled to the fourth gate, and the fifth drain is coupled to the fourth drain and the third gate; and a capacitor module, coupled between the first drain and the third drain and controlled by the control signal, wherein the third gate works as an output terminal of the boost circuit.

3. The level shift as claimed in claim 2, wherein the capacitor module comprises:

a sixth transistor, having a sixth source, a sixth gate and a sixth drain, wherein the sixth source and the sixth drain are coupled together to an input terminal of the capacitor module;

a seventh transistor, having a seventh source, a seventh gate and a seventh drain, wherein the seventh source and the seventh drain are coupled together to the input terminal of the capacitor module, and the seventh gate is coupled to the output terminal of the capacitor module;

a eighth transistor, having a eighth source, a eighth gate and a eighth drain, wherein the eighth source and the eighth drain are coupled together to the input terminal of the capacitor module and the eighth gate is coupled to the output terminal of the capacitor module; and a transmission gate, coupled between the sixth gate and the output terminal of the capacitor module, and controlled by the control signal and an inverse of the control signal.

4. The level shifter as claimed in claim 1, wherein the level shift circuit further comprises:

a eleventh transistor, having a eleventh source, a eleventh gate and a eleventh drain, wherein the eleventh source is coupled to the second voltage source;

a twelfth transistor, having a twelfth source, a twelfth gate and a twelfth drain, wherein the twelfth source is coupled to the second voltage source;

a thirteenth transistor, having a thirteenth drain, a thirteenth gate and a thirteenth source, wherein the thirteenth drain is coupled to the twelfth gate and the eleventh drain, the thirteenth gate is coupled to the output terminal of the first boost circuit, and the thirteenth source is coupled to ground;

a fourteenth transistor, having a fourteenth drain, a fourteenth gate and a fourteenth source, wherein the fourteenth drain is coupled to the eleventh gate and the twelfth drain, the fourteenth gate is coupled to the output terminal of the second boost circuit, and the fourteenth source is coupled to the ground;

a second inverter, powered by the second voltage source, having an input terminal coupled to the fourteenth drain, and having an output terminal;

a third inverter, powered by second voltage source, having an input terminal coupled to the fourteenth drain, and having an output terminal;

a seventeenth transistor, having a seventeenth source, a seventeenth gate and a seventeenth drain, wherein the seventeenth source is coupled to the second voltage source, the seventeenth gate is coupled to the output terminal of the second inverter;

a twentieth transistor, having a twentieth drain, a twentieth gate and a twentieth source, wherein the twentieth drain is coupled to the seventeenth drain, the twentieth gate is coupled to the output terminal of the third inverter, and the twentieth source is coupled to the ground; and a diode, having an anode and a cathode, wherein the anode is coupled to the ground and the cathode is coupled to the twentieth drain, wherein the seventeenth drain provides the output signal of the level shift circuit.

5. The level shifter as claimed in claim 4, wherein the level shift circuit further comprises:

a first resistor, coupled between the eleventh drain and the thirteenth drain; and a second resistor, coupled between the twelfth drain and the fourteenth drain.

6. The level shifter as claimed in claim 2, wherein the level shift circuit further comprises:

a third resistor, coupled between the seventeenth drain and the twentieth drain.

* * * * *